United States Patent
Weaver

(10) Patent No.: US 7,187,119 B2
(45) Date of Patent: Mar. 6, 2007

(54) METHODS AND STRUCTURES FOR REDUCING LATERAL DIFFUSION THROUGH COOPERATIVE BARRIER LAYERS

(75) Inventor: Michael Stuart Weaver, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 113 days.

(21) Appl. No.: 10/712,492

(22) Filed: Nov. 13, 2003

(65) Prior Publication Data

US 2004/0119068 A1 Jun. 24, 2004

Related U.S. Application Data

(63) Continuation of application No. 09/820,540, filed on Mar. 29, 2001, now Pat. No. 6,664,137.

(51) Int. Cl.
*H05B 33/00* (2006.01)
(52) U.S. Cl. .............. 313/504; 313/506; 313/512; 257/99; 257/40
(58) Field of Classification Search .............. 313/504, 313/506, 512; 257/99, 40
See application file for complete search history.

(56) References Cited

U.S. PATENT DOCUMENTS

| | | | | |
|---|---|---|---|---|
| 4,357,557 A | 11/1982 | Inohara et al. | ............. | 313/509 |
| 5,051,654 A | 9/1991 | Nativi et al. | ............. | 313/506 |
| 5,686,360 A | 11/1997 | Harvey et al. | ............. | 438/126 |
| 5,707,745 A | 1/1998 | Forrest et al. | ............. | 428/432 |
| 5,757,126 A | 5/1998 | Harvey, III et al. | ......... | 313/506 |
| 5,771,562 A | 6/1998 | Harvey, III et al. | ........ | 29/592.1 |
| 5,882,761 A | 3/1999 | Kawami et al. | ............. | 428/69 |
| 5,952,778 A | 9/1999 | Haskal et al. | ............. | 313/504 |
| 5,962,962 A | 10/1999 | Fujita et al. | ............. | 313/412 |
| 6,083,313 A | 7/2000 | Venkatraman et al. | . | 106/287.14 |
| 6,146,225 A | 11/2000 | Sheats et al. | ............. | 445/24 |
| 6,150,187 A | 11/2000 | Zyung et al. | ............. | 438/126 |
| 6,537,688 B2* | 3/2003 | Silvernail et al. | .......... | 428/690 |
| 6,576,351 B2* | 6/2003 | Silvernail | .......... | 428/690 |
| 6,597,111 B2* | 7/2003 | Silvernail et al. | .......... | 313/506 |
| 6,614,057 B2* | 9/2003 | Silvernail et al. | ........... | 257/99 |
| 6,624,568 B2* | 9/2003 | Silvernail | .......... | 313/504 |

(Continued)

FOREIGN PATENT DOCUMENTS

EP  0 977 469 A2  2/2000

(Continued)

*Primary Examiner*—Laura M. Schillinger
(74) *Attorney, Agent, or Firm*—Mayer & Williams PC; David B. Bonham, Esq.

(57) ABSTRACT

A covered substrate is described, which comprises: (a) a flexible substrate layer; and (b) a plurality of cooperative barrier layers disposed on the substrate layer. The plurality of cooperative barrier layers further comprise one or more planarizing layers and one or more high-density layers. Moreover, at least one high-density layer is disposed over at least one planarizing layer in a manner such that the at least one high-density layer extends to the substrate layer and cooperates with the substrate layer to completely surround the at least one planarizing layer. When combined with an additional barrier region, such covered substrates are effective for enclosing organic optoelectronic devices, such organic light emitting diodes, organic electrochromic displays, organic photovoltaic devices and organic thin film transistors. Preferred organic optoelectronic devices are organic light emitting diodes.

16 Claims, 8 Drawing Sheets

U.S. PATENT DOCUMENTS

| | | | |
|---|---|---|---|
| 6,664,137 B2 * | 12/2003 | Weaver | 438/125 |
| 6,704,133 B2 * | 3/2004 | Gates et al. | 359/296 |
| 6,835,950 B2 * | 12/2004 | Brown et al. | 257/40 |
| 6,888,305 B2 * | 5/2005 | Weaver | 313/506 |
| 6,888,307 B2 * | 5/2005 | Silvernail et al. | 313/512 |
| 6,897,474 B2 * | 5/2005 | Brown et al. | 257/40 |
| 6,998,648 B2 * | 2/2006 | Silvernail | 257/99 |
| 7,012,363 B2 * | 3/2006 | Weaver et al. | 313/504 |
| 2002/0068143 A1 * | 6/2002 | Silvernail et al. | 428/76 |
| 2002/0113548 A1 * | 8/2002 | Silvernail | 313/506 |
| 2002/0125484 A1 * | 9/2002 | Silvernail et al. | 257/79 |
| 2002/0140347 A1 * | 10/2002 | Weaver | 313/506 |
| 2003/0038590 A1 * | 2/2003 | Silvernail et al. | 313/504 |
| 2003/0098647 A1 * | 5/2003 | Silvernail et al. | 313/506 |
| 2003/0117066 A1 * | 6/2003 | Silvernail | 313/504 |
| 2003/0127973 A1 * | 7/2003 | Weaver et al. | 313/504 |
| 2004/0119068 A1 * | 6/2004 | Weaver | 257/40 |
| 2005/0212419 A1 * | 9/2005 | Vazan et al. | 313/512 |
| 2005/0227390 A1 * | 10/2005 | Shtein et al. | 438/22 |

FOREIGN PATENT DOCUMENTS

| | | |
|---|---|---|
| JP | 07169569 | 7/1995 |
| JP | 09153395 | 6/1997 |
| WO | WO 99/02277 | 1/1999 |
| WO | WO 99/39393 | 8/1999 |
| WO | WO 00/26973 | 5/2000 |
| WO | WO 00/36665 | 6/2000 |
| WO | WO 00/65879 | 11/2000 |

* cited by examiner

METHODS AND STRUCTURES FOR REDUCING LATERAL DIFFUSION THROUGH COOPERATIVE BARRIER LAYERS

STATEMENT OF RELATED APPLICATION

This is a continuation of U.S. patent application Ser. No. 09/820,540, filed Mar. 29, 2001, and entitled "Methods and Structures for Reducing Lateral Diffusion through Cooperative Barrier Layers." now U.S. Pat. No. 6,664,137.

FIELD OF THE INVENTION

The present invention relates to structures that protect organic optoelectronic devices from the surrounding environment.

BACKGROUND OF THE INVENTION

Organic optoelectronic devices, including circuits, such as organic light emitting diodes, organic electrochromic displays, organic photovoltaic devices and organic thin film transistors, are known in the art and are becoming increasingly important from an economic standpoint.

As a specific example, organic light emitting devices ("OLEDs"), including both polymer and small-molecule OLEDs, are potential candidates for a great variety of virtual- and direct-view type displays, such as lap-top computers, televisions, digital watches, telephones, pagers, cellular telephones, calculators and the like. Unlike inorganic semiconductor light emitting devices, organic light emitting devices are generally simple and relatively easy and inexpensive to fabricate. Also, OLEDs readily lend themselves to applications requiring a wide variety of colors and to applications that concern large-area devices. In general, two-dimensional OLED arrays for imaging applications are known in the art and are typically composed of a plurality of OLEDs (one or more of which forms a pixel) arranged in rows and columns. Each individual OLED in the array is typically constructed with a first transparent anode (such as ITO), an organic electroluminescent layer on the first electrode, and a metallic cathode on the organic electroluminescent medium. Other OLED architectures are also known in the art such as transparent OLEDs (transparent cathode contact), and inverted OLEDs. Substrate materials may include glass, plastic, metal foil, silicon wafers, etc.

In forming an OLED, a layer of metal is typically utilized as the cathode to ensure efficient electron injection and low operating voltages. However, metals and their interface with the organic material are susceptible to oxygen and moisture, which can severely limit the lifetime of the devices. Moreover, moisture and oxygen are also known to increase "dark spot areas" in connection with OLEDs. Components of various other organic optoelectronic devices (e.g., organic electrochromic displays, organic photovoltaic devices and organic thin film transistors) are likewise susceptible to attack from exterior environmental species, including water and oxygen.

SUMMARY OF THE INVENTION

The above and other challenges are addressed by the present invention.

According to a first embodiment of the invention, a covered substrate is provided, which comprises: (a) a flexible substrate layer; and (b) a plurality of cooperative barrier layers disposed on the substrate layer. The plurality of cooperative barrier layers in this embodiment further comprise one or more planarizing layers and one or more high-density layers. Moreover, at least one high-density layer is disposed over at least one planarizing layer in a manner such that the at least one high-density layer extends to the substrate layer and cooperates with the substrate layer to completely surround the at least one planarizing layer.

According to a second embodiment of the invention an organic optoelectronic device structure is provided, which comprises: (a) a first barrier region comprising a flexible substrate layer and a plurality of cooperative barrier layers disposed on the substrate layer; (b) an organic optoelectronic device disposed over the first barrier region, the organic optoelectronic device selected from an organic light emitting diode, an organic electrochromic display, an organic photovoltaic device and an organic thin film transistor; and (c) a second barrier region disposed over the organic optoelectronic device. As in the prior embodiment, the plurality of cooperative barrier layers further comprises one or more planarizing layers and one or more high-density layers. Moreover, at least one high-density layer is disposed over at least one planarizing layer in a manner such that the at least one high-density layer extends to the substrate layer and cooperates with the substrate layer to completely surround the at least one planarizing layer. Preferred organic optoelectronic devices are organic light emitting diodes.

For each of these embodiments, each overlying first cooperative barrier layer that is disposed over one or more underlying first cooperative barrier layers preferably extends to the substrate layer in a manner such that the one or more underlying first cooperative barrier layers are surrounded by the substrate layer and the overlying first cooperative barrier layer.

Preferably, the first cooperative barrier layers comprise an alternating series of two or more first planarizing layers and two or more first high-density layers, and more preferably comprise an alternating series of 3 to 7 first planarizing layers and 3 to 7 first high-density layers.

The second barrier region in the second embodiment above can, like the first barrier region, comprise a plurality of second cooperative barrier layers, which further comprise one or more second planarizing layers and one or more second high-density layers. At least one second high-density layer is preferably disposed over at least one second planarizing layer in a manner such that the at least one second high-density layer extends to the first barrier region and cooperates with the first barrier region to completely surround the at least one second planarizing layer. The second cooperative barrier layers can be arranged in essentially the same fashion as the first barrier layers.

One advantage of the present invention is that organic optoelectronic structures are produced that provide an effective barrier between the organic optoelectronic device and the ambient atmosphere, reducing adverse effects due to chemical species in the ambient atmosphere, such as moisture and oxygen.

Another advantage of the present invention is that organic optoelectronic structures are provided that address problems associated with lateral diffusion of moisture and oxygen within their barrier layers.

These and other embodiments and advantages of the present invention will become readily apparent to those of ordinary skill in the art upon review of the disclosure to follow.

BRIEF DESCRIPTION OF THE DRAWINGS

FIG. 1b is a cross-sectional view of an OLED structure, which utilizes the covered substrate of FIG. 1a.

As is commonly the case with such figures, the above are simplified schematic representations and the actual structures will differ in numerous respects including the relative scale of the components.

DETAILED DESCRIPTION

The present invention now will be described more fully hereinafter with reference to the accompanying drawings in which preferred embodiments of the invention are shown. This invention may, however, be embodied in different forms and should not be construed as limited to the embodiments set forth herein.

As used herein, a "layer" of a given material includes a region of that material whose thickness is small compared to both its length and width. Examples of layers include sheets, foils, films, laminations, coatings, and so forth. As used herein a layer need not be planar, but can be bent, folded or otherwise contoured, for example, to at least partially envelop another component.

Figure 2:
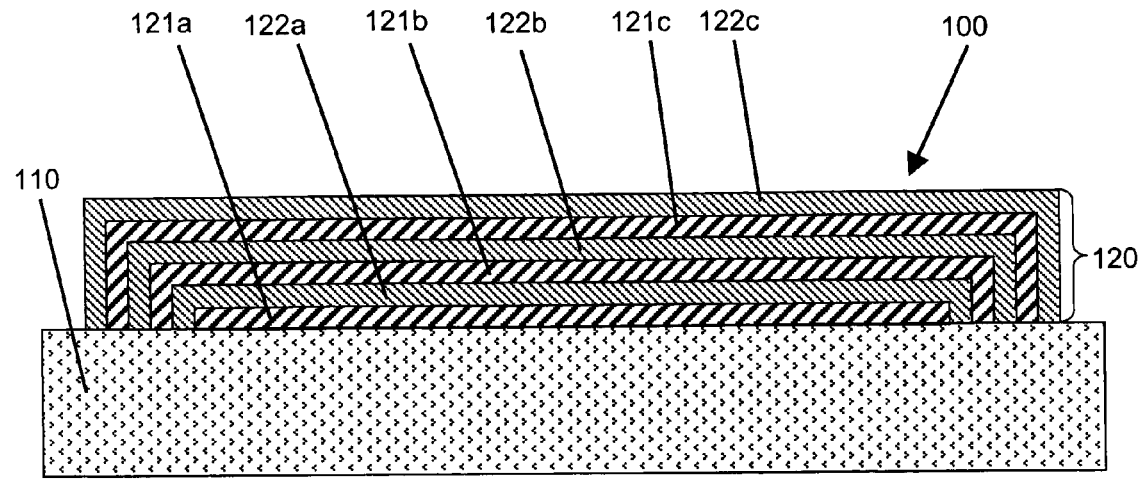
FIG. 2 is a cross-sectional view of a covered substrate in accordance with an embodiment of the present invention.

Referring now to FIG. 2, a covered substrate 100 is shown in accordance with an embodiment of the invention. The covered substrate 100 includes a substrate layer 110 and a barrier region 120 (which is composed of multiple cooperative barrier layers as discussed below) disposed on the substrate layer 110.

The substrate layer 110 can be a rigid or flexible layer. It is preferably a flexible layer and is typically selected based on one or more characteristics, such as flexibility and conformability to other surfaces, dimensional stability during processing (e.g., where web-based processing is contemplated), adequate bonding with other components such as the cooperative barrier layers of the barrier region 120, and optical characteristics.

Preferred flexible substrate layers contain paper, fabric, metal foil, flexible glass layers (available, for example, from Schott Glass Technologies), and/or polymer layers.

More preferred flexible layers are layers that comprise one or more of the polymer components, including polyesters, polycarbonates, polyethers, polyimides, polyolefins, and fluorocarbons that are capable of providing a strong adhesive bond with other materials. Such components can be found, for example, in homopolymers, copolymers and polymer blends. Examples of some preferred polymer components include, for example, polyethersulphones, polyarylates, polyestercarbonates, polyethylenenaphthalates, polyethyleneterephthalates, polyetherimides, polyacrylates, Kapton® polyimide film available from DuPont, Appear® PNB (polynorbornene) available from BF Goodrich, Aclar® fluoropolymer available from Honeywell, and Arton® available from BF Goodrich The substrate layer 110 typically ranges from 75 to 625 microns in thickness.

As with the substrate layer 110, the barrier region 120 is also typically selected based on one or more the above characteristics. Moreover, in its role as a barrier, the barrier region 120 also acts to block the transport of oxygen, water and any other detrimental molecules from the outside environment.

Preferred barrier regions 120 for the practice of the present invention are cooperative barrier layers that include both layers of planarizing material 121a–c and layers of high-density material 122a–c. These cooperative barrier layers are preferably provided in an alternating configuration. Preferably, 1 to 10 pairs of these layers, more preferably 3 to 7 pairs, are used. Although three alternating pairs are illustrated in FIG. 2, other layer arrangements are possible. Moreover, while it is preferred for the bottom layer to be a layer of planarizing material 121a as shown in FIG. 2, the bottom layer can also be, for example, a layer of high-density material. Also, while the structure in FIG. 2 is shown as terminating in a high-density layer 122c, the top layer can be, for example, a planarizing layer.

By "planarizing material" is meant a material that forms a smooth planar surface upon application, rather than forming a surface that reflects irregular contours of the underlying surface. A preferred material is one that, when deposited onto a surface, forms a non-conformal liquid. This could be, for example, a polyacrylate monomer (this material is then subjected to ultraviolet light, crosslinking the monomer to form a polyacrylate). Preferred planarizing materials are polymers, such as fluorinated polymers, parylenes, cyclotenes and polyacrylates. Layers of such planarizing materials 121a–c can be provided using techniques known in the art, for example, by dipping, spin coating, sputtering, evaporative coating, spraying, flash evaporation, chemical vapor deposition and so forth.

By "high-density material" is meant a material with sufficiently close atomic spacing such that diffusion of outside species, particularly water and oxygen, are hindered. Preferred high-density materials include inorganic materials such as silicon oxides (SiOx), including silicon monoxide (SiO) and silicon dioxide ($SiO_2$), silicon nitrides (typically $Si_3N_4$), silicon oxynitrides, aluminum oxides (typically $Al_2O_3$), indium-tin oxides (ITO) and zinc indium tin oxides. Metals are also effective, particularly where transparency is not required. Layers of high-density material 122a–c can be applied using techniques known in the art such as thermal evaporation, sputtering, plasma-enhanced chemical vapor deposition (PECVD) methods and electron-beam techniques.

Examples of multilayer barrier regions comprising layers of both high-density material and layers of planarizing material are disclosed, for example, in U.S. Pat. No. 5,757,126, the entire disclosure of which is hereby incorporated by reference.

Figure 1A:
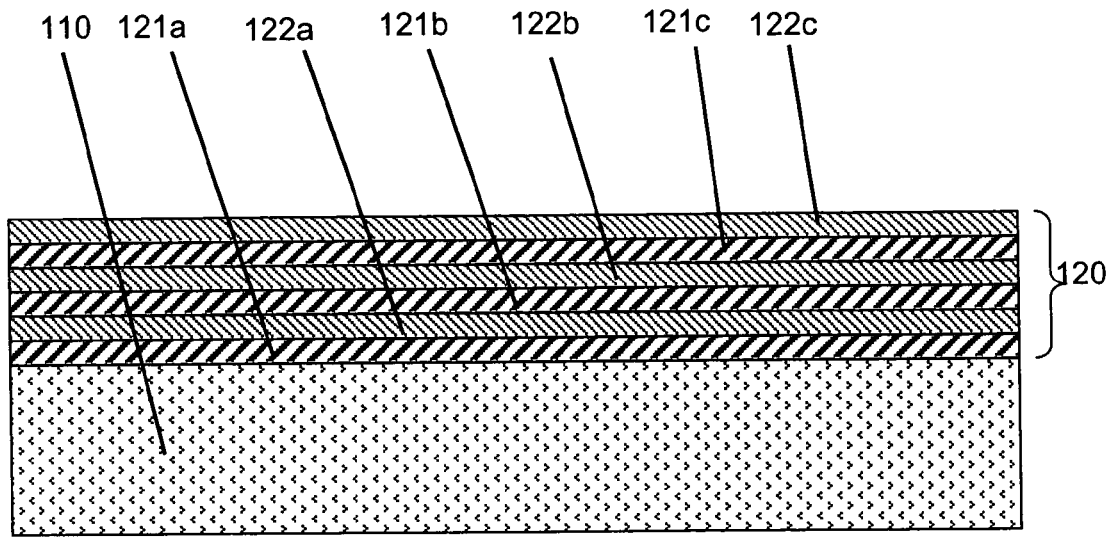
FIG. 1a is a cross-sectional view of a covered substrate.

Continuous processing techniques, such as web-based processing techniques, typically involve the formation of large sheets of material. Such large sheets can be subsequently subdivided into sheet sizes appropriate for the final application (e.g., into sheets the size of a computer monitor screen). In the case of a barrier region containing cooperative barrier layers on a substrate, cutting a large sheet produces a structure with exposed edges like that shown in FIG. 1a. Unfortunately, in exposing the edges of layers 121a–c and 122a–c in the barrier region 120, lateral diffusion of moisture and oxygen, as well as other species, becomes increasingly problematic.

Figure 1B:
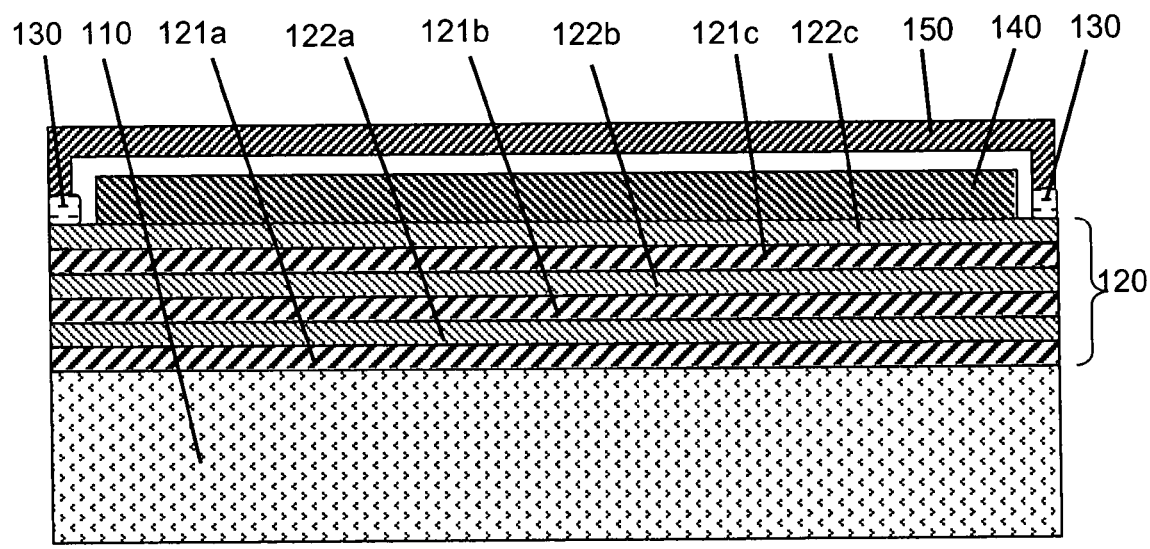

This difficulty can be better seen with reference to FIG. 1b, which illustrates an OLED 140 disposed on the barrier region 120. An additional barrier region 150 (a metal can is shown) is secured to the structure by adhesive region 130, to protect the OLED 140 from the surrounding environment.

From this structure, it can be seen that the ends of each of the layers 121a–c and 122a–c are exposed to exterior moisture in oxygen. The diffusivity of water and oxygen in the planarizing layers 1221a–c is significantly greater than the diffusivity of these species in the high-density layers 122a–c. Hence, layers 121a–c each presents a path of relatively low resistance to moisture and oxygen.

This situation is improved by the structures of the present invention. For example, reference is now made to FIG. 3 in which an OLED 140, an additional barrier region 150 and an adhesive region 130 are provided in connection with the covered substrate 100 of FIG. 2, forming an OLED structure 190. In contrast to FIG. 1b, however, each planarizing layer 121a–c is separated from the outside environment by at least one high-density layer 122a–c. As a result, lateral diffusion of water and oxygen within the planarizing layers 121a–c is reduced relative to FIG. 1b.

Figure 10:
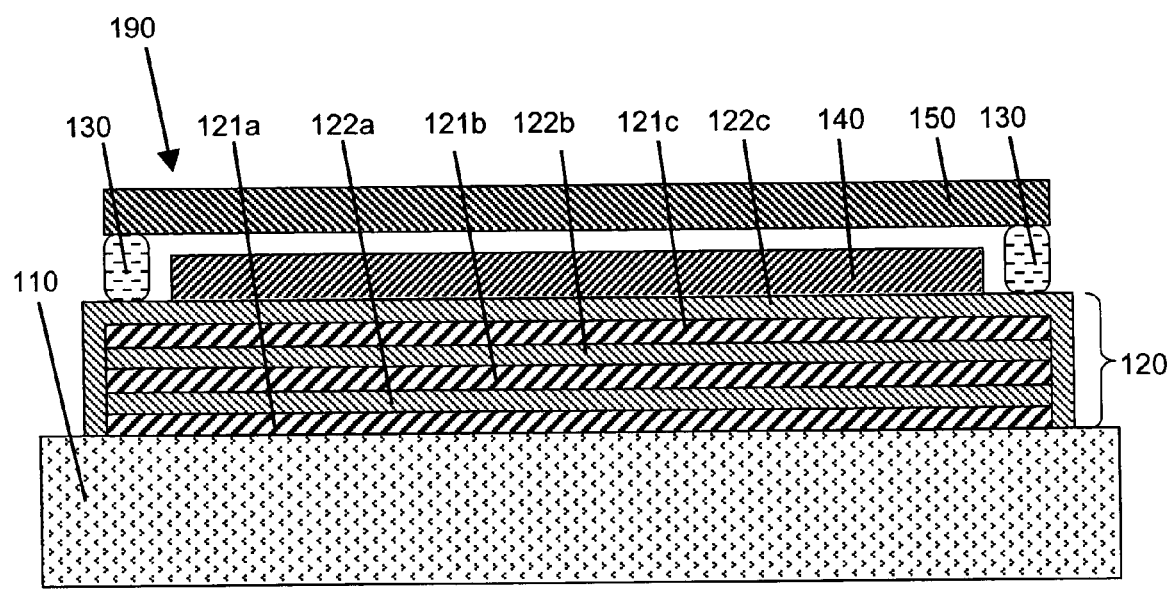
FIG. 10 is a cross-sectional view of an OLED structure, which utilizes a covered substrate in accordance with an embodiment of the present invention.

Although the cooperative barrier layers 121b–c and 122a–c in this embodiment each completely covers an underlying cooperative barrier layer (i.e., by covering the top of the underlying layer and extending down the sides of the underlying layer to the substrate), benefits can be achieved by completely covering underlying layers with only a single layer, for example, a high-density layer 122c, as shown in FIG. 10.

Referring again to FIG. 3, adhesive region 130 is disposed between the high-density layer 122c and the additional barrier region 150, bonding the additional barrier region 150 to the layer 122c. The adhesive region 130 is selected to provide a good bond between the layer 122c and the additional barrier region 150 and to provide a barrier to moisture and oxygen, without damaging the OLED during curing (e.g., due to off-gassing). Preferred materials for these purposes include ultraviolet-curable and thermally curable epoxy materials. Preferred epoxy materials are ultraviolet curable, single-part epoxies such as Epotek OG159. The thickness of the adhesive region typically ranges from 25 to 100 microns.

Figure 3:
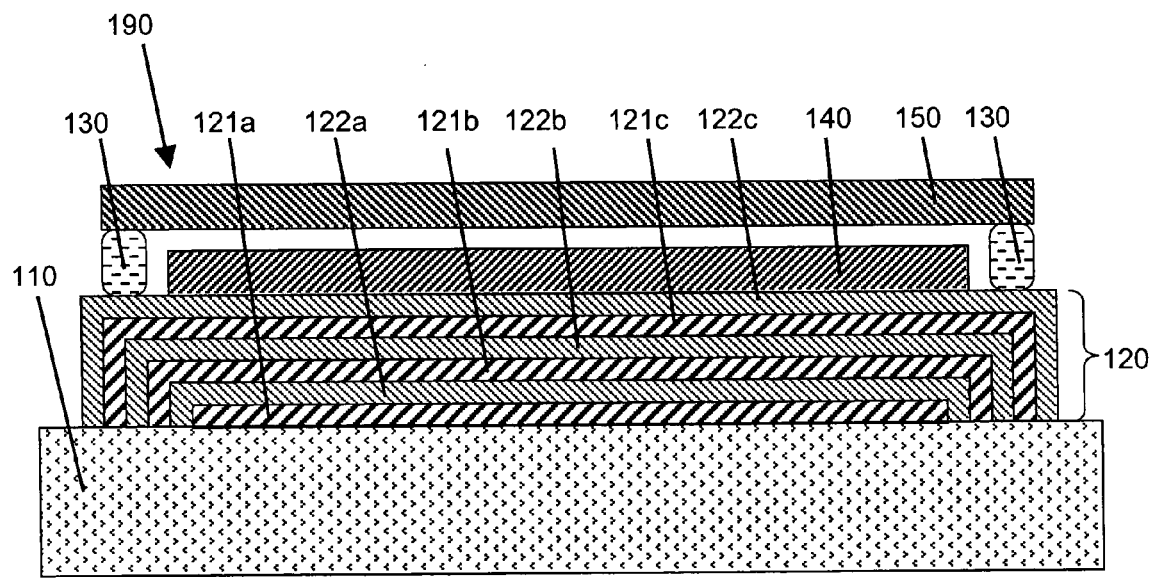
FIG. 3 is a cross-sectional view of an OLED structure, which utilizes the covered substrate of FIG. 2, in accordance with an embodiment of the present invention.

Although not necessarily immediately apparent from the two-dimensional rendering of FIG. 3, the adhesive region 130 typically encircles the OLED 140, having an appearance somewhat like that of a gasket occupying the space between layer 122c and the additional barrier region 150. As a result, in the embodiment shown, adhesive region 130 cooperates with the layer 122c and the additional barrier region 150 to isolate the OLED from the outside environment.

In some embodiments of the invention, a gettering material (not shown) is placed adjacent the OLED 140, such that the gettering material (along with the OLED) is surrounded by the layer 122c, additional barrier region 150 and adhesive region 130. The gettering material acts to capture any moisture, oxygen, etc. that may reach the interior of the device 190 and harm the OLED 140. Preferred gettering materials include CaO and BaO. One particularly preferred product is HICAP2000, a CaO paste obtainable from Cookson SPM.

The OLED structure can be any OLED known in the art. For example, as noted above, the OLED will generally comprise an anode layer (typically transparent), a cathode layer, and a light-emitting layer (emission layer) disposed between the anode and cathode layer. The light emitting layer can be provided in connection with a number of configurations, including the following: (a) a three-layer configuration comprising a hole transporting layer, an emission layer and an electron transporting layer (i.e., a double heterostructure configuration), (b) a two-layer configuration comprising a hole transporting layer and a layer that provides both emission and electron transporting functions or a two-layer configuration comprising an electron transporting layer and a layer that provides both emission and hole transporting functions (i.e., single heterostructure configurations) and (c) a configuration comprising a single layer that provides hole transporting, electron transporting and emission functions (i.e., a single layer configuration). In each configuration, additional layers may also be present, for example, layers that enhance hole injection or electron injection, or layers that serve to block holes or electrons. Several structures for such devices are discussed, for example, in U.S. Pat. No. 5,707,745, the entire disclosure of which is hereby incorporated by reference. Other more complex OLED architectures are also practiced in the art.

Although an OLED 140 is shown in connection with the various figures, other organic optoelectronic devices, such as organic electrochromic displays, organic photovoltaic devices and organic thin film transistors, can be used in place of the OLED 140 that is shown.

Depending on the application, the additional barrier region 150 opposite the OLED 140 from layer 122c may or may not be required to be optically transparent. Typical materials for the additional barrier region 150 include polymers, ceramics and metals.

Metals are frequently preferred due to their excellent barrier properties, and can be provided in a number of configurations such as in the form of a metal can and or metal foil, with metal foils being preferred due to ease of manufacture. Preferred metal foils include aluminum, gold and indium, as well as other foils known in the art. The additional barrier region 150 may or may not contact the OLED 140.

Like metals, ceramics also offer low permeability and provide transparency in many cases. Preferred ceramics are glasses, more preferably soda lime and borosilicate glasses.

Polymers are often preferred where optical transparency is desired or where ease of continuous manufacture (e.g., web-based manufacture) is desired. Preferred polymers include polyesters, polyethersulphones, polyimides and fluorocarbons.

Figure 6:
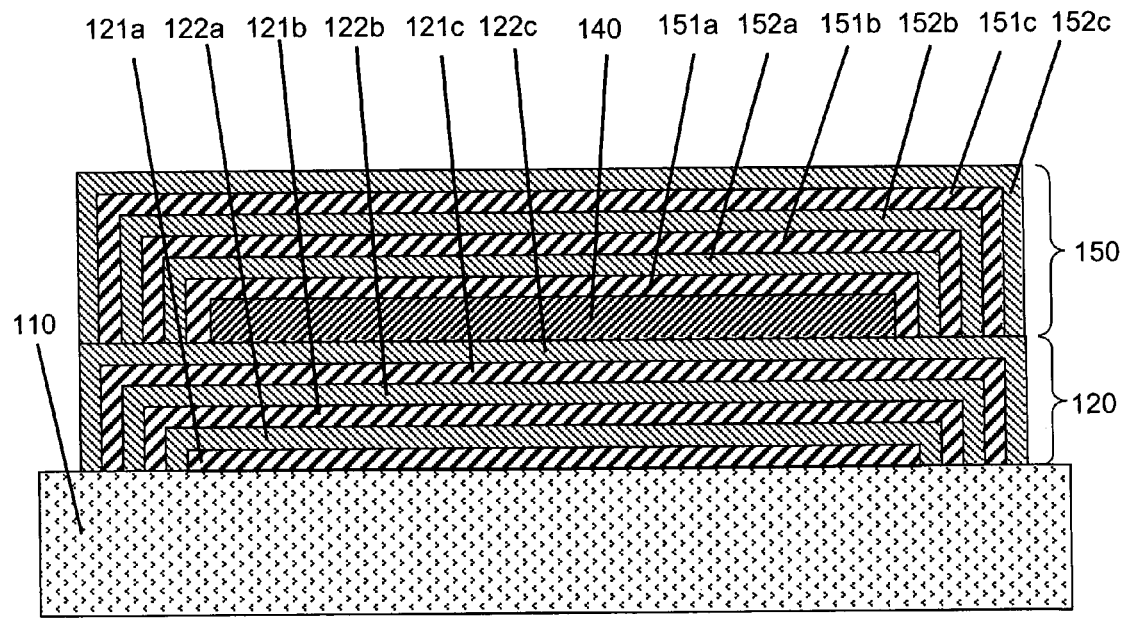
FIG. 6 is a cross-sectional view of an OLED structure, which utilizes the covered substrate of FIG. 2, in accordance with an embodiment of the present invention.

Polymers can also be provided as planarizing layers in connection with a series of cooperative barrier layers, such as those discussed above in connection with the barrier layer 120. An embodiment of such as structure is shown in FIG. 6, which illustrates an additional barrier region 150 consisting of an alternating series of planarizing layers 151a–c and high-density layers 152a–c. In this embodiment, no adhesive region 130 is used, since sufficient bonding strength between the successive layers exists.

Figure 7:
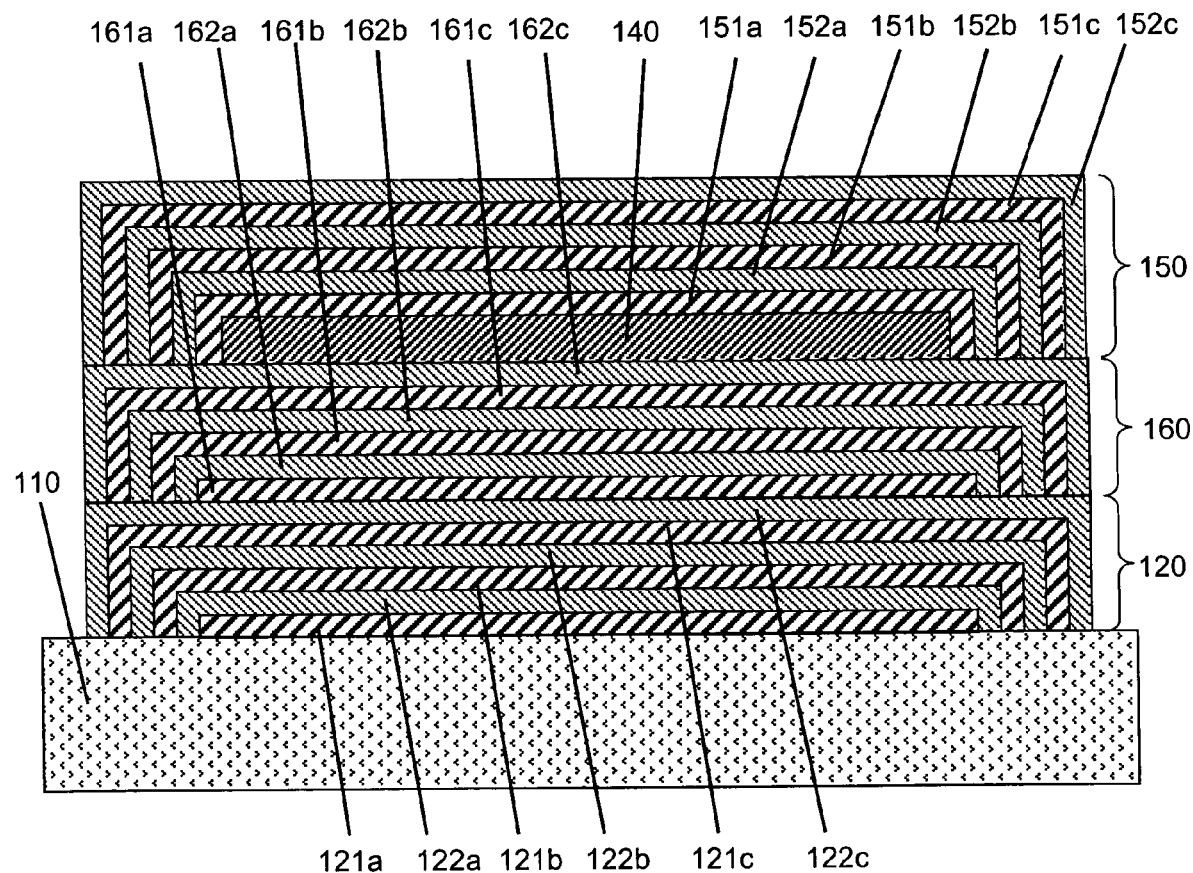
FIG. 7 is a cross-sectional view of an OLED structure, in accordance with an embodiment of the present invention.

In some instances, however, the substrate layer 110 can become saturated with water. One consequence of this situation is that layer 122c as illustrated in FIG. 6 can also become saturated with water over time. Because layer 122c is in direct contact with the OLED 140, this is particularly problematic. One way of addressing this challenge is to provide an additional barrier region 160 between the layer 122c and the OLED 140 as shown in FIG. 7. As with barrier region 120, barrier region 160 is preferably composed of multiple cooperative barrier layers. For example, layers of planarizing material 161a–c and layers of high-density material 162a–c can be provided as shown.

Figure 4A:
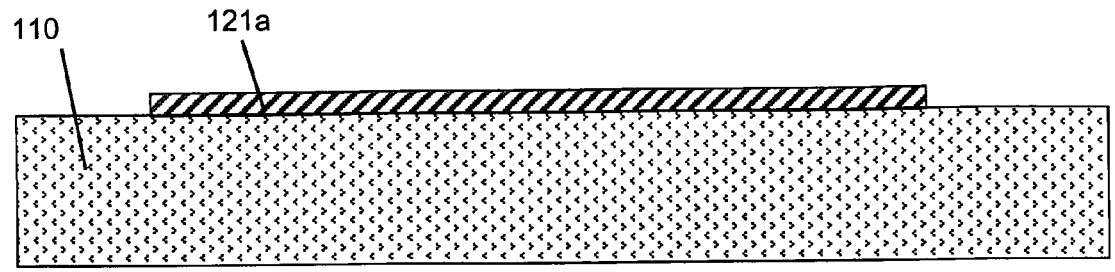
FIGS. 4a–4g are cross-sectional views illustrating a process for forming the covered substrate of FIG. 2 and the OLED structure of FIG. 3, in accordance with an embodiment of the present invention.
Figure 4B:
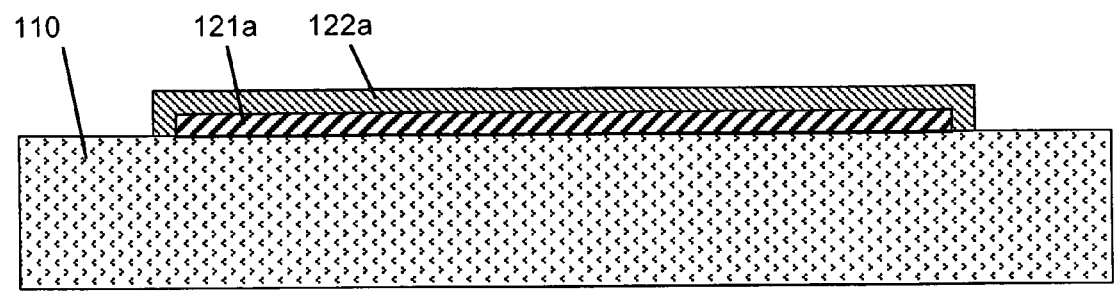
Figure 4C:
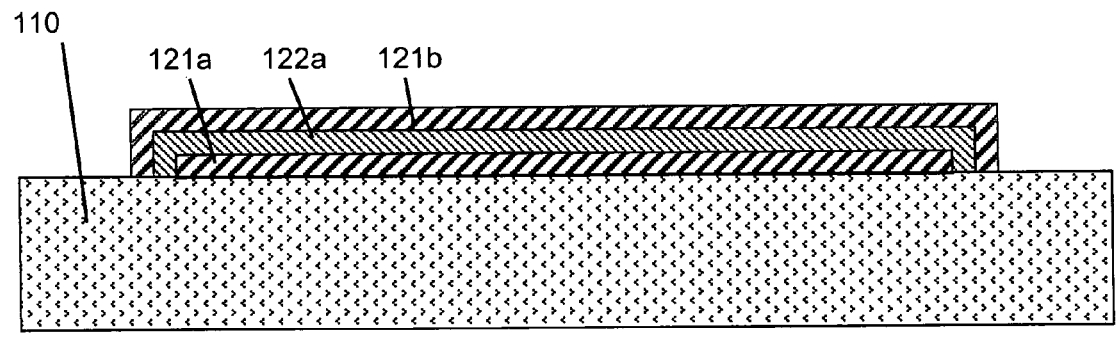
Figure 4D:
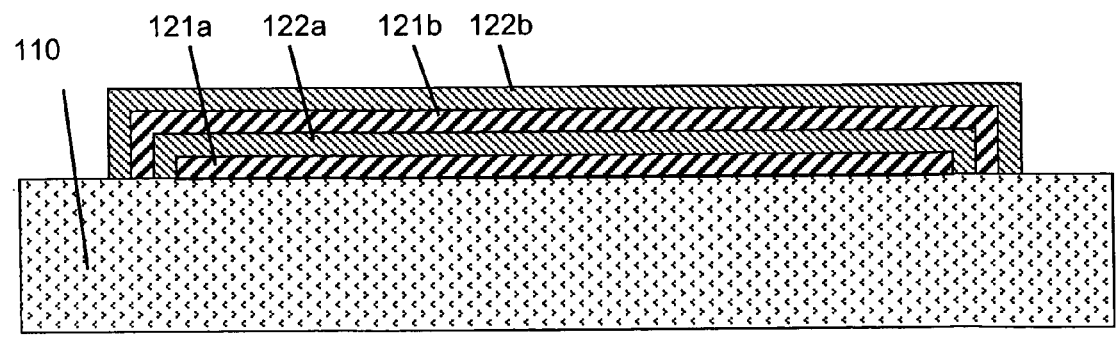
Figure 4E:
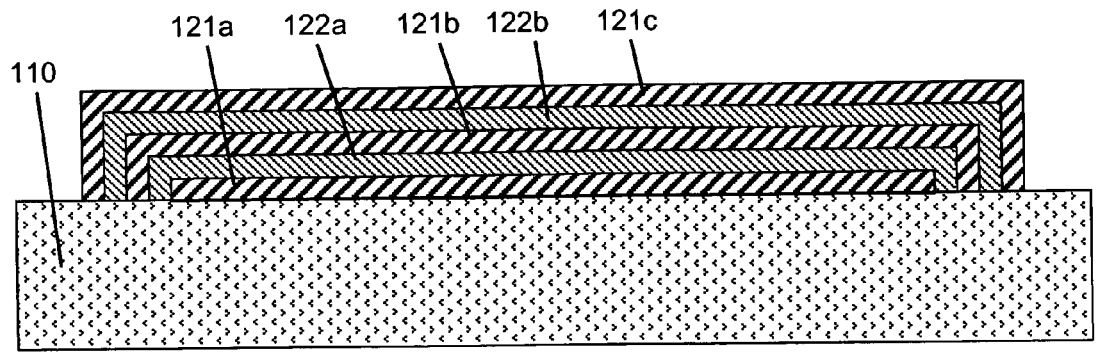

The formation of planarizing and high-density layers over a substrate material will now be discussed in connection with FIGS. 4a–4g, FIG. 8 and FIG. 9. Referring now to FIG. 4a, a first planarizing material layer 121a is first deposited on a substrate 110. (As previously noted, a high-density layer can be deposited first, rather than a planarizing layer). Subsequently, as shown in FIG. 4b, a first high-density material layer 122a is deposited over the first planarizing material layer 121a. The area covered by the first high-density material layer 122a is sufficiently larger than the area of the first planarizing material layer 121a, such that the first high-density material layer 122a completely covers the first planarizing material layer 121a and extends to the substrate 110 on all sides. In this way the first high-density material layer 122a and the substrate 110 together act to completely enclose the first planarizing material layer 121a.

Figure 4F:
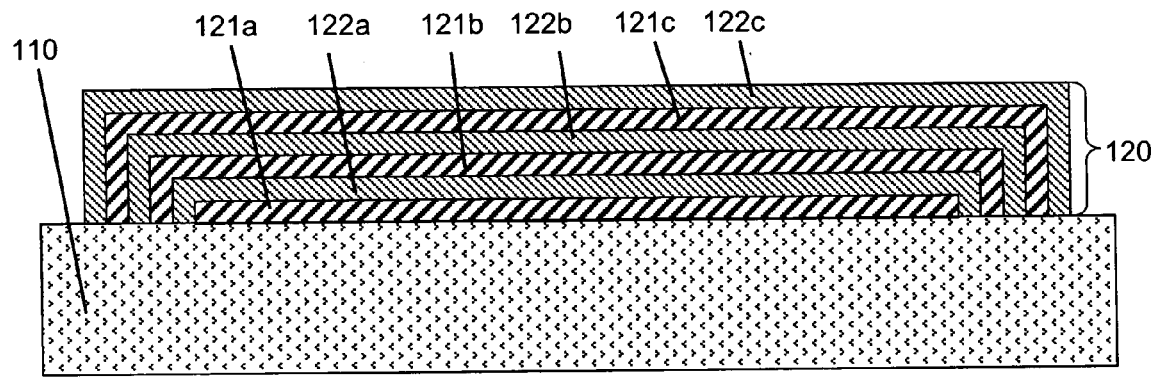

Subsequently, in a similar fashion, a second planarizing material layer 121b is deposited over the first high-density material layer 122a (see FIG. 4c), followed by the deposition of a second high-density material layer 122b (FIG. 4d), a third planarizing material layer 121c (FIG. 4e), and a third high-density material layer 122c (FIG. 4f).

Figure 4G:
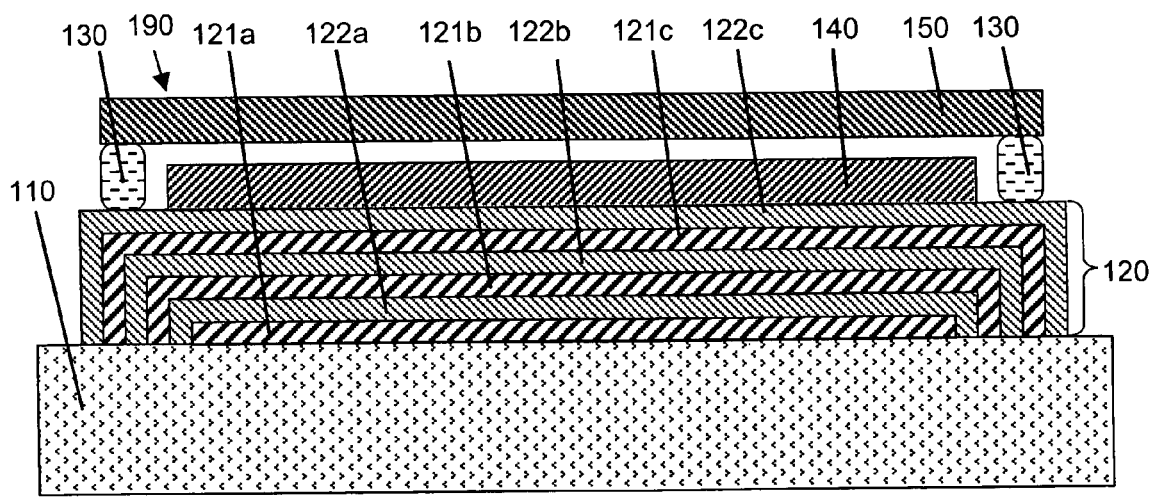

After deposition of the desired number of planarizing and high-density layers (three pairs are shown), an OLED 140 is then provided on the now-covered substrate using known techniques as shown in FIG. 4g. An additional barrier region 150 is then adhered to the substrate via adhesive region 130 in this embodiment, completely enclosing the OLED 140 within the OLED structure 190, protecting it from moisture and oxygen.

Figure 8:
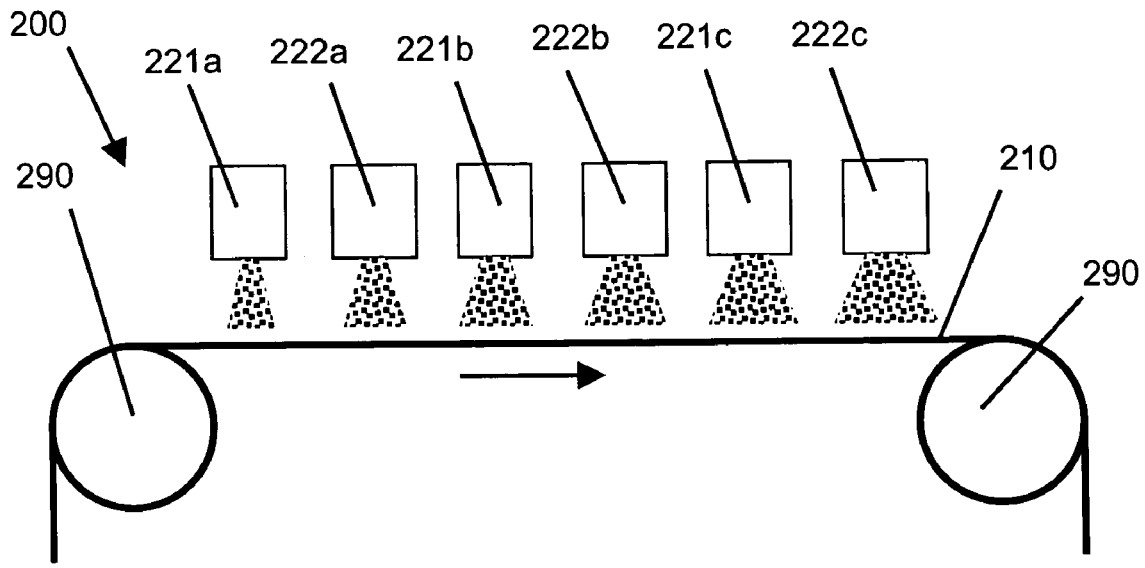
FIG. 8 is a schematic diagram of an apparatus for forming the covered substrate of FIG. 2, in accordance with an embodiment of the invention.

Deposition of progressively larger cooperative barrier layers can be achieved in a number of ways. Preferred techniques are continuous techniques such as web-based processing techniques. An apparatus 200 containing various rolls (only rolls 290 are shown) for material movement, material cooling and so forth, as well as other components such as ultraviolet curing lights, is illustrated in FIG. 8. Using this apparatus 200, a web of substrate 210 is passed under several deposition sources 221a–c and 222a–c within a web-coating apparatus. In this embodiment, sources 221a–c are used for the deposition of materials for planarizing layers, while sources 222a–c are used for the deposition of materials for high-density layers. Preferred sources are thermal evaporation, sputtering, PECVD and electron beam sources for the high-density layers, and thermal evaporation, organic vapor phase deposition (OVPD), chemical vapor deposition (CVD), spraying and flash evaporation sources for the planarization layers.

An arrow indicates the direction of substrate 210 movement within apparatus 200. Deposition source 221a, is first used to deposit first planarizing material layer 121a. Then, deposition source 222a is used to deposit first high-density material layer 122a, deposition source 221b is used to deposit second planarizing material layer 121b, deposition source 222b is used to deposit second high-density material layer 122b, deposition source 221c is used to deposit third planarizing material layer 121c, and deposition source 222c is used to deposit third high-density material layer 122c.

In FIG. 8, each deposition source is provided with an aperture that is larger than that of the adjacent upstream source (i.e., the source to the left), such that the material being deposited from each source progressively covers a wider area as the substrate proceeds downstream (i.e., from left to right).

Figure 9:
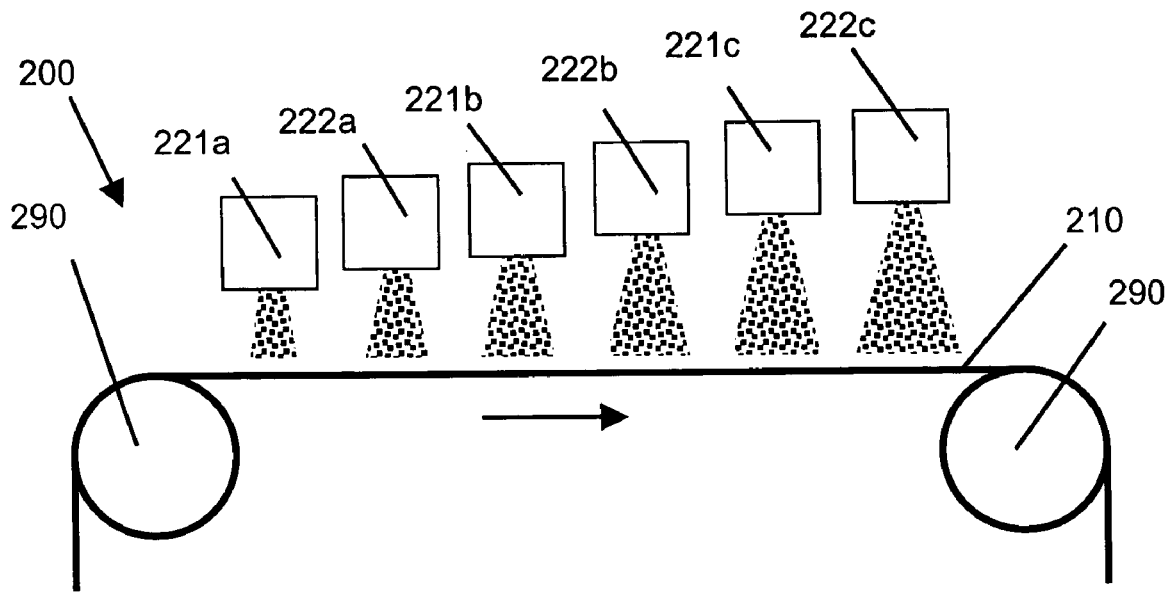
FIG. 9 is a schematic diagram of another apparatus for forming the covered substrate of FIG. 2, in accordance with an embodiment of the invention.

Other embodiments are clearly possible. For example, as shown in FIG. 9, each deposition source can have the same aperture. However, in this embodiment, each source 221b–c and 222a–c is provided at a larger distance from the substrate than is the adjacent upstream source (i.e., the source to the left), such that the material being deposited from each source again covers a progressively wider area as the substrate proceeds downstream (i.e., from left to right).

Figure 5:
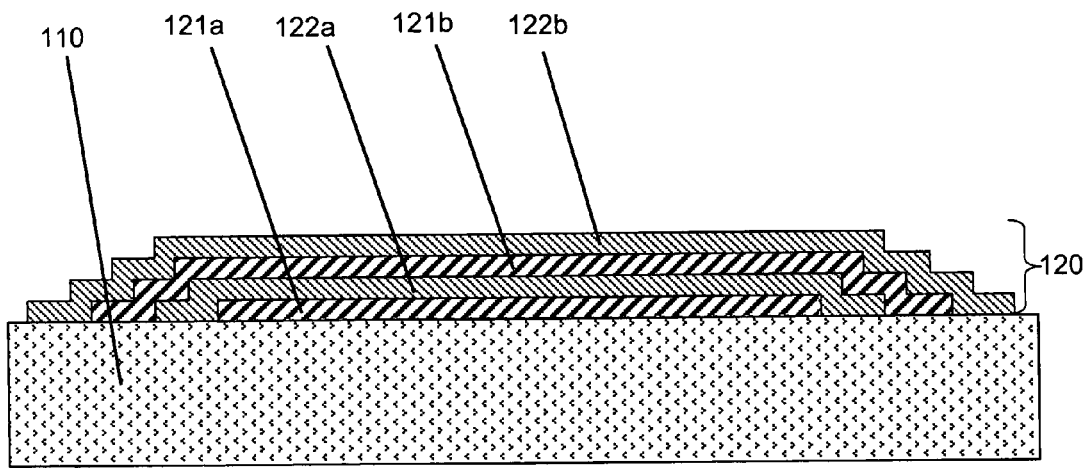
FIG. 5 is a cross-sectional view of a covered substrate, in accordance with an embodiment of the present invention.

Coverage of a given cooperative barrier layer can extend beyond the minimum amount needed to cover the top and sides of the underlying layer. For instance, as shown in FIG. 5, layers 122a, 121b, 122b can each spread out over the substrate 110 surface by a certain amount.

Although the present invention has been described with respect to several exemplary embodiments, there are many other variations of the above-described embodiments that will be apparent to those of ordinary skill in the art. It is understood that these variations are within the teachings of the present invention, and that the invention is to be limited only by the claims appended hereto.

The invention claimed is:

1. An organic optoelectronic device structure comprising:
   a substrate;
   an organic optoelectronic device disposed over said substrate, said organic optoelectronic device selected from an organic light emitting diode, an organic electrochromic display, an organic photovoltaic device and an organic thin film transistor; and
   a barrier region disposed over said organic optoelectronic device, said barrier region comprising a plurality of cooperative barrier layers, said plurality of cooperative barrier layers further comprising a planarizing layer and a high-density layer, wherein said high-density layer is disposed over said planarizing layer in a manner such that said high-density layer extends to said substrate and, in conjunction with said substrate, completely surrounds said planarizing layer.

2. The OLED structure of claim 1, wherein said plurality of cooperative barrier layers comprises two or more planarizing layers and two or more high-density layers, and wherein each overlying cooperative barrier layer that is disposed over one or more underlying cooperative barrier layers extends to the substrate in a manner such that said one or more underlying cooperative barrier layers are surrounded by said substrate and said each overlying cooperative barrier layer.

3. The organic optoelectronic device structure of claim 1, wherein said cooperative barrier layers comprise an alternating series of two or more planarizing layers and two or more high-density layers.

4. The organic optoelectronic device structure of claim 3, wherein said alternating series comprises 3 to 7 planarizing layers and 3 to 7 high-density layers.

5. The organic optoelectronic device structure of claim 1, wherein said planarizing layer compnses a material selected from fluorinated polymers, parylenes, cyclotenes and polyacrylates.

6. The organic optoelectronic device structure of claim 1, wherein said high-density layer comprises a material selected from metal oxides, metal nitrides, metal carbides, metals and metal oxynitrides.

7. The organic optoelectronic device structure of claim 1, wherein said high-density layer comprises a material selected from silicon oxide, silicon nitride, aluminum oxide, indium tin oxide and zinc indium tin oxide.

8. The organic optoelectronic device structure of claim 1, wherein said organic optoelectronic device is an OLED device.

9. The organic optoelectronic device structure of claim 1, wherein said substrate is a rigid substrate.

10. The organic optoelectronic device structure of claim 1, wherein said substrate is a flexible substrate.

11. The organic optoelectronic device structure of claim 1, wherein said substrate comprises a metal foil.

12. The organic optoelectronic device structure of claim 1, wherein said substrate comprises a rigid glass layer.

13. The organic optoelectronic device structure of claim 1, wherein said organic optoelectronic device is an organic electrochromic display.

14. The organic optoelectronic device structure of claim 1, wherein said organic optoelectronic device is an organic photovoltaic device.

15. The organic optoelectronic device structure of claim 1, wherein said organic optoelectronic device is an organic thin film transistor.

16. The organic optoelectronic device structure of claim 1, wherein said substrate comprises a polymeric substrate layer and a barrier region disposed over said polymeric substrate layer, said barrier region comprising a plurality of cooperative barrier layers which comprise a planarizing layer and a high-density layer.

* * * * *

UNITED STATES PATENT AND TRADEMARK OFFICE
CERTIFICATE OF CORRECTION

| | | |
|---|---|---|
| PATENT NO. | : 7,187,119 B2 | |
| APPLICATION NO. | : 10/712492 | |
| DATED | : March 6, 2007 | |
| INVENTOR(S) | : Michael Stuart Weaver | |

It is certified that error appears in the above-identified patent and that said Letters Patent is hereby corrected as shown below:

Title Page, Abstract (57), line 12, after "such" insert -- as -- .

Specification, Col. 1, line 11, after "Layers", change "." to -- , -- .

Specification, Col. 4, line 18, after "more", insert -- of -- .

Specification, Col. 5, line 24, after "layers", change "1221$a$-$c$", to -- 121$a$-$c$ -- .

Specification, Col. 5, line 26, after "each", change "presents" to -- present -- .

Specification, Col. 6, line 15, change "light emitting" to -- light-emitting --.

Specification, Col. 6, line 18, before "layer", change "hole transporting" to -- hole-transporting --.

Specification, Col. 6, line 19, before "layer", change "electron transporting" to -- electron-transporting --.

Specification, Col. 6, line 21, before "layer", change "hole transporting" to -- hole-transporting --.

Specification, Col. 6, line 22, before "functions", change "electron transporting" to -- electron-transporting --.

Specification, Col. 6, line 23, after "an" change "electron transporting" to -- electron-transporting --.

Specification, Col. 6, line 24-25, change "hole transporting" to -- hole-transporting --.

Specification, Col.6, line 65, before "structure", change "as" to -- a -- .

UNITED STATES PATENT AND TRADEMARK OFFICE
CERTIFICATE OF CORRECTION

PATENT NO. : 7,187,119 B2
APPLICATION NO. : 10/712492
DATED : March 6, 2007
INVENTOR(S) : Michael Stuart Weaver It is certified that error appears in the above-identified patent and that said Letters Patent is hereby corrected as shown below:

Claim 5, Col. 9, line 2, after "layer", change "compnses" to --comprises -- .

Signed and Sealed this

Twenty-sixth Day of June, 2007

JON W. DUDAS
*Director of the United States Patent and Trademark Office*